United States Patent [19]
Walden

[11] Patent Number: 5,336,624
[45] Date of Patent: Aug. 9, 1994

[54] METHOD FOR DISGUISING A MICROELECTRONIC INTEGRATED DIGITAL LOGIC

[75] Inventor: Robert H. Walden, Newbury Park, Calif.

[73] Assignee: Hughes Aircraft Company, Los Angeles, Calif.

[21] Appl. No.: 986,637

[22] Filed: Dec. 7, 1992

Related U.S. Application Data

[62] Division of Ser. No. 742,799, Aug. 9, 1991, Pat. No. 5,202,591.

[51] Int. Cl.$^5$ .......................... H01L 21/265
[52] U.S. Cl. .......................... 437/29; 437/8; 437/34; 437/913; 437/45
[58] Field of Search .................. 437/56, 29, 926, 8, 437/34, 913

[56] References Cited

U.S. PATENT DOCUMENTS

| | | | |
|---|---|---|---|
| 4,409,434 | 10/1983 | Basset et al. | |
| 4,472,871 | 9/1984 | Green et al. | 437/29 |
| 4,530,150 | 7/1985 | Shirato | 437/29 |
| 4,583,011 | 4/1986 | Pechar. | |
| 4,766,516 | 8/1988 | Ozdemir et al. | |
| 4,922,136 | 5/1990 | Ueda. | |
| 4,952,824 | 8/1990 | Kamuro. | |
| 5,015,594 | 5/1991 | Chu et al. | 437/34 |
| 5,021,356 | 6/1991 | Hendersen et al. | 437/45 |

OTHER PUBLICATIONS

Patent Abstracts of Japan, vol. 014, No. 463 (E-988) Oct. 8, 1990 & JP-A-21 88 944 (Sharp K.K.) Jul. 25, 1990.

*Primary Examiner*—Olik Chaudhuri
*Assistant Examiner*—H Jey Tsai
*Attorney, Agent, or Firm*—V. D. Duraiswamy; W. K. Denson-Low

[57] ABSTRACT

Focussed ion beam (FIB) implants (38,40) are used to set the threshold voltages of metal-oxide-semiconductor field-effect transistors (MOSFETs) in a selected logic gate (34,36) in a microelectronic integrated digital logic circuit (31) such that the direct current (DC) transfer function and logic thresholds are essentially the same as for another logic gate (30,32) which is not altered by FIB implants, but the switching speed is greatly reduced. This causes the altered gate (34,36) to switch in an apparently normal manner when tested under DC or low speed conditions, but to not switch at normal operating speed. The altered or disguised gate (34,36) is thereby always on or always off at the normal operating speed, whereas the unaltered gate (30,32) switches in the normal manner. This impedes attempts at reverse engineering since the circuit (31) operates differently under test and operating conditions, and the true logic functions of the gate (34,36) cannot be determined by known low speed test procedures.

14 Claims, 5 Drawing Sheets

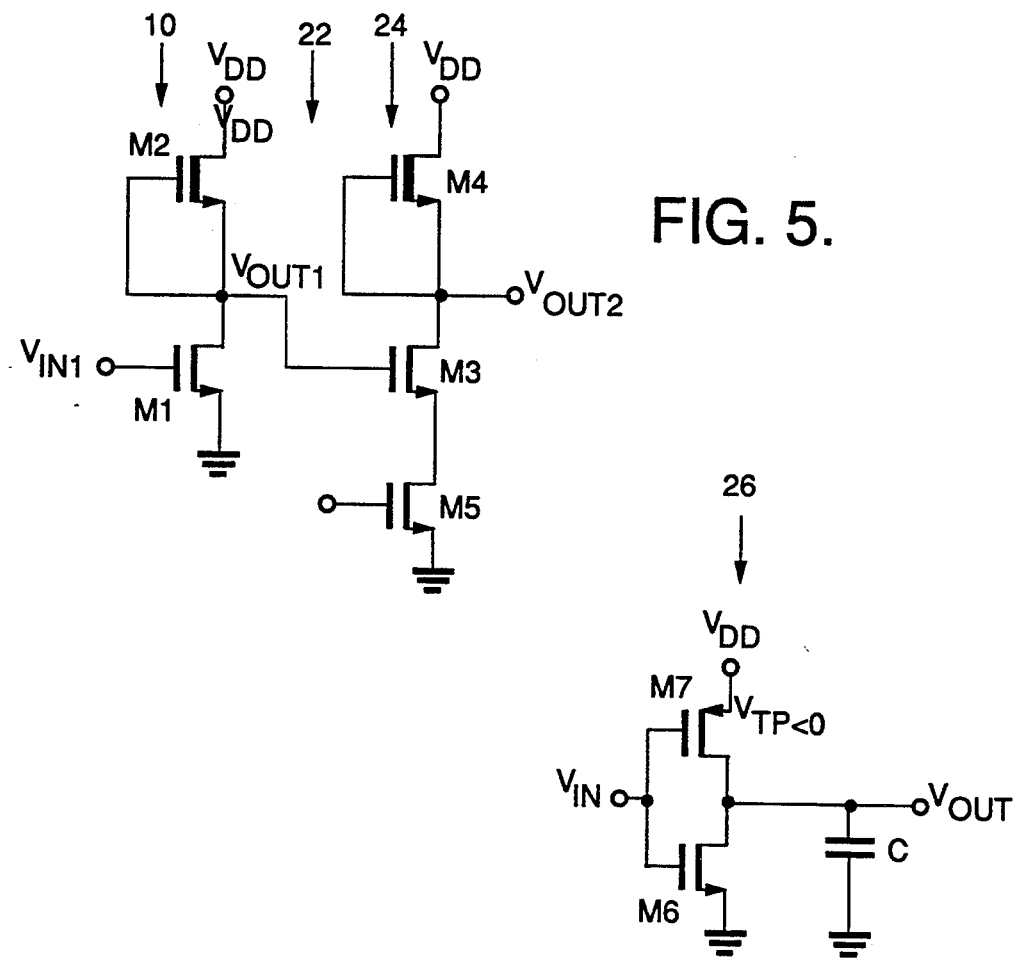
FIG. 5.
FIG. 6.
(PRIOR ART)
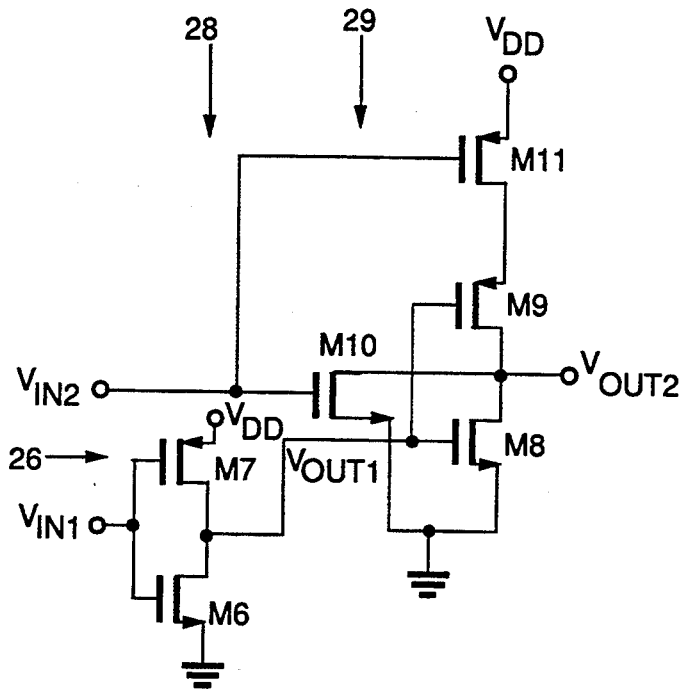
FIG. 7.

METHOD FOR DISGUISING A MICROELECTRONIC INTEGRATED DIGITAL LOGIC

This is a division of application Ser. No. 07/742,799 filed Aug. 9, 1991, now U.S. Pat. No. 5,202,591.

BACKGROUND OF THE INVENTION

1. Field of the Invention

The present invention relates to a method for disguising a microelectronic integrated digital logic circuit which deters attempts to analyze the logical structure of the circuit by reverse engineering.

2. Description of the Related Art

A method for protecting hardware integrated circuits or microcircuits against unauthorized copying and/or use is described in U.S. Pat. No. 4,766,516, entitled "Method and Apparatus for Securing Integrated Circuits from Unauthorized Copying and Use", issued Aug. 23, 1988, to F. Ozdemir et al, and assigned to Hughes Aircraft Company, the assignee of the present invention. According to this technique, at least one additional circuit element that does not contribute towards the function of an integrated circuit (IC), but rather inhibits the proper functioning of the IC in case of an attempted copying, analysis, or other unauthorized use, is fabricated along with the overall IC.

The identities of the additional circuit elements are disguised by forming them with the visible appearance of apparent elements, but with physical modifications that are not readily visible to a copyist but cause them to function in a different manner. Such modifications include very narrow open circuit cuts in metallized connection lines, preferably made with a focused ion beam (FIB) or laser beam; disordering the lattice structure or changing the doping level of a semiconductor region, preferably with a FIB; and injecting electrical charge into a semiconductor region, preferably with an electron beam.

The FIB modifications include implantation of ions into the channel regions of field effect transistors (FETs) to change the threshold voltages thereof and cause them to be always on or always off. The modifications themselves are virtually undetectable. However, it is at least theoretically possible to analyze the actual logical functions of the altered FETs using digital computers programmed to perform sophisticated permutational analysis algorithms.

SUMMARY OF THE INVENTION

Reverse engineering utilizes internal probing which adds capacitance to the circuit nodes under test. This requires that the testing be performed at DC or very low clock speeds to enable the added capacitance to charge sufficiently that the logic gates themselves will not function erroneously. The present invention provides a method for using FIB implants to set the threshold voltages of metal-oxide-semiconductor (MOS) field-effect transistors (FETs) in selected logic gates in a microelectronic integrated digital logic circuit such that the direct current (DC) transfer function and logic thresholds are essentially the same as for the other logic gates (not altered by FIB implants), but the switching speeds are greatly reduced (preferably by a factor of at least ten). This causes the altered gates to switch in an apparently normal manner when tested under DC or low speed conditions, but to not switch at normal operating speed. The altered gates are thereby always on or always off at the normal operating speed.

Altering some of the FETs in this manner deters attempts at reverse engineering since the circuit operates differently under test and operating conditions, and the true logic functions of the gates cannot be determined by known low speed test procedures.

A microelectronic integrated digital logic circuit embodying the present invention comprises a first microelectronic digital logic switching element having a first maximum switching speed which is higher than a predetermined switching speed at which the circuit is designed to operate. A second microelectronic digital logic switching element is logically associated with the first switching element and has a second maximum switching speed which is lower than the predetermined switching speed such that the first and second switching elements both switch at switching speeds lower than the second switching speed, and only the first switching element switches at the predetermined switching speed.

In a preferred embodiment of the invention, the switching elements include n-channel metal-oxide-semiconductor (NMOS) FETs connected in a depletion mode active load configuration. In another preferred embodiment of the invention, the switching elements include complementary metal-oxide-semiconductor (CMOS) FETs connected in a symmetrical configuration.

In a method of fabricating a microelectronic integrated digital logic circuit embodying the present invention, the threshold voltages of the FETs in the second switching element are altered by FIB implantation to be closer to the switching voltage thereof than in the first switching element, thereby causing the second switching speed to be lower than the first switching speed. The switching voltages of the first and second switching elements are preferably equal, causing the DC transfer functions and logical thresholds of the switching elements to be essentially similar.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 5 is an electrical schematic diagram illustrating an NMOS logic gate arrangement embodying the present invention;

FIG. 6 is an electrical schematic diagram illustrating an known CMOS inverter configuration for the purpose of describing the principles of the present invention;

FIG. 7 is an electrical schematic diagram illustrating an exemplary CMOS logic gate arrangement embodying the present invention;

DETAILED DESCRIPTION OF THE INVENTION

Figure 1:
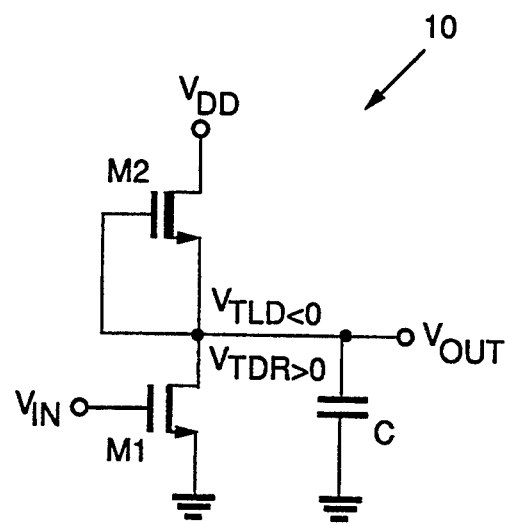
FIG. 1 is an electrical schematic diagram illustrating an known NMOS depletion mode load inverter configuration for the purpose of describing the principles of the present invention.

Referring to FIG. 1 of the drawing, a known inverter circuit 10 includes an n-channel enhancement mode (NMOS) driver FET M1 connected in series circuit with an n-channel depletion mode NMOS load FET M2 between a drain supply $V_{DD}$ and ground. The gate of the load FET M2 is connected to the junction of the FETs M1 and M2 to provide an active load configuration. The driver FET M1 has a threshold voltage $V_{TDR}$ which is more positive than zero, whereas the load FET M2 has been altered by ion implantation to have a threshold voltage $V_{TLD}$ which is more negative than zero. The output capacitance of the inverter circuit 10 and the capacitances of the following logic circuits (not shown) are lumped together and symbolically illustrated as a capacitor C.

Figure 2:
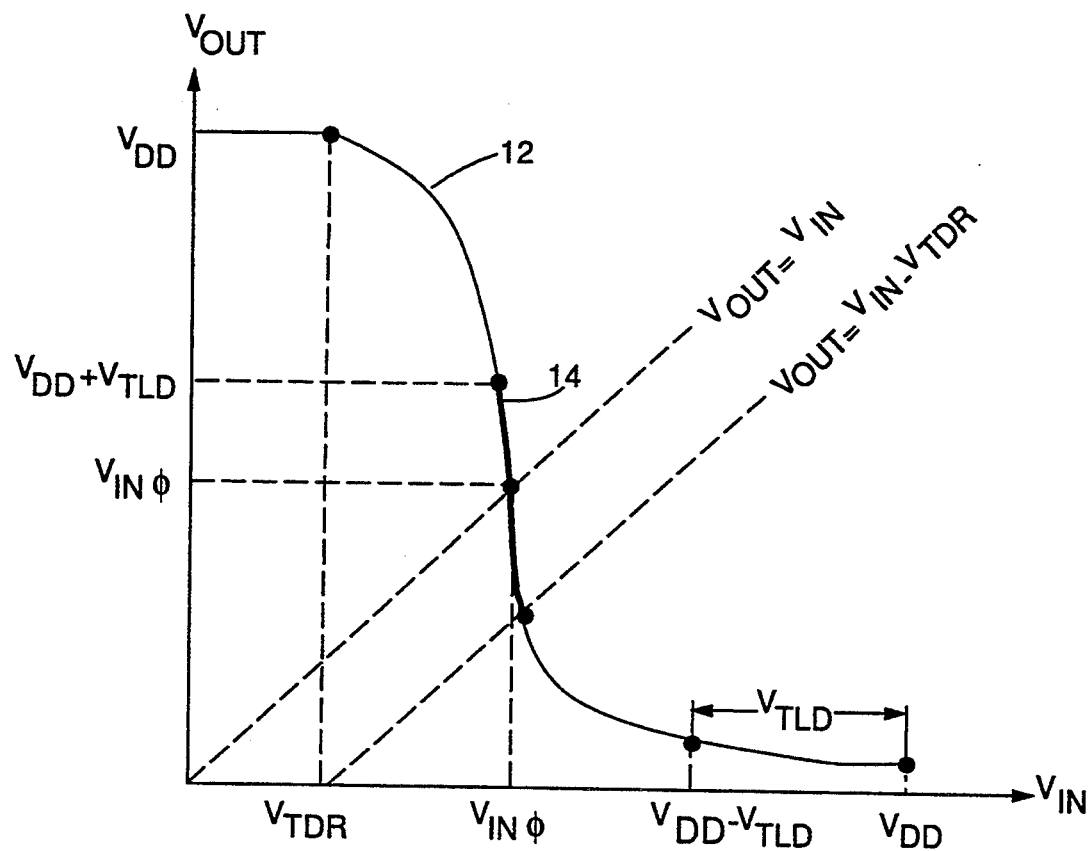
FIG. 2 is a graph illustrating the voltage transfer function for the inverter of FIG. 1.

The DC transfer function of the inverter circuit 10 is illustrated in FIG. 2 as a curve 12. The output voltage $V_{OUT}$ is approximately equal to the drain supply voltage $V_{DD}$ for an input voltage $V_{IN}$ of zero, and approaches zero as the input voltage $V_{IN}$ increases toward $V_{DD}$. Both FETS M1 and M2 are in saturation in a region 14 of the curve 12 between the values of $V_{OUT}=V_{DD}+V_{TLD}$ and $V_{OUT}=V_{IN}-V_{TDR}$. A line representing $V_{OUT}=V_{IN}$ intersects the curve 12 at a point $V_{IN0}$ which is designated as a switch point or switching voltage of the inverter circuit 10. It will be noted that the threshold voltage $V_{TDR}$ of the driver FET M1 is measured in the positive direction from zero, whereas the threshold voltage $V_{TLD}$ of the load FET M2 is measured in the negative direction from $V_{DD}$.

The output voltage $V_{OUT}$ begins to transition from high to low as the input voltage $V_{IN}$ increases from zero through the voltage $V_{TDR}$, and begins to transition from low to high as the input voltage $V_{IN}$ decreases from $V_{DD}$ through the voltage $V_{DD}-V_{TLD}$. The switch from high to low and vice-versa is approximately centered on the switching voltage $V_{IN0}$. The absolute values of the threshold voltages $V_{TDR}$ and $V_{TLD}$ are approximately equal, but will not be exactly equal due to non-linearities in the transfer curve 12, and are different from the switching voltage $V_{IN0}$ by approximately equal voltages. In other words, the voltages $V_{TDR}$ and $V_{DD}-V_{TLD}$ are spaced approximately symmetrically about the switching voltage $V_{IN0}$.

The current $I_{LD}$ through the load FET M2 in the saturation region 14 is given as $$I_{LD} = \frac{W_{LD}}{L} K_N V_{TLD}^2 (1 + \lambda(V_{DD} - V_{OUT})) \quad \text{equ. 1}$$

where $W_{LD}$ is the channel width of the load FET M2. L is the channel length, $K_N$ is the transconductance parameter, and $\lambda$ is the channel-length modulation parameter of the FETs M1 and M2 (assumed to be equal).

The current $I_{DR}$ through the driver FET M1 in the saturation region 14 is given as $$I_{DR} = \frac{W_{DR}}{L} K_N (V_{IN} - V_{TDR})^2 (1 + \lambda V_{OUT}) \quad \text{equ. 2}$$

where $W_{DR}$ is the channel width of the driver FET M1. equating the currents $I_{LD}=I_{DR}$ gives $$V_{OUT} = \frac{W_{LD} V_{TLD}^2 (1 + \lambda V_{DD}) - W_{DR} (V_{IN} V_{TDR})^2}{\lambda[W_{LD} V_{TLD}^2 + W_{DR} (V_{IN} V_{TDR})^2]} \quad \text{equ. 3}$$

where $V_{IN}-V_{TDR} \leq V_{OUT} \leq V_{DD}+V_{TLD}$.

Setting $V_{OUT}=V_{IN}=V_{IN0}$ produces the relationship between $V_{TDR}$ and $V_{TLD}$ which keeps the switching voltage $V_{IN0}$ constant. This may be expressed as $$V_{TDR} + \sqrt{\frac{W_{LD}}{W_{DR}}} |V_{TLD}| = V_{IN\phi} \quad \text{equ. 4}$$

The switching speed of the inverter circuit 10 may be approximated in terms of the rise time $T_R$, based on the differential relationship $\Delta V/\Delta T=I_{LD}/C$, where $T_R=\Delta T$ and the channel-length modulation $\lambda$ is taken as zero.

$$T_R = \Delta T \approx \frac{C \Delta V}{I_{LD}} \approx \frac{C V_{DD}}{\frac{W_{LD}}{L} K_N V_{TLD}^2} \quad \text{equ. 5}$$

This may be rewritten as $$T_R \approx \frac{L C V_{DD}}{W_{LD} K_N V_{TLD}^2} \quad \text{equ. 6}$$

Equation (6) shows that $T_R$ is inversely proportional to the square of the threshold voltage $V_{TLD}$ of the load FET M2. Thus, the value of $V_{TLD}$ which produces a selected rise time $T_R$ (and corresponding switching speed) may be approximated by $$V_{TLD} \sim \sqrt{\frac{L C V_{DD}}{W_{LD} K_N T_R}} \quad \text{equ. 7}$$

The corresponding value of the threshold voltage $V_{TDR}$ of the driver FET M1 which maintains the switching voltage $V_{IN0}$ approximately constant is given as $$V_{TDR} = V_{IN\phi} - \sqrt{\frac{W_{LD}}{W_{DR}}} |V_{TLD}| \quad \text{equ. 8}$$

Figure 3:
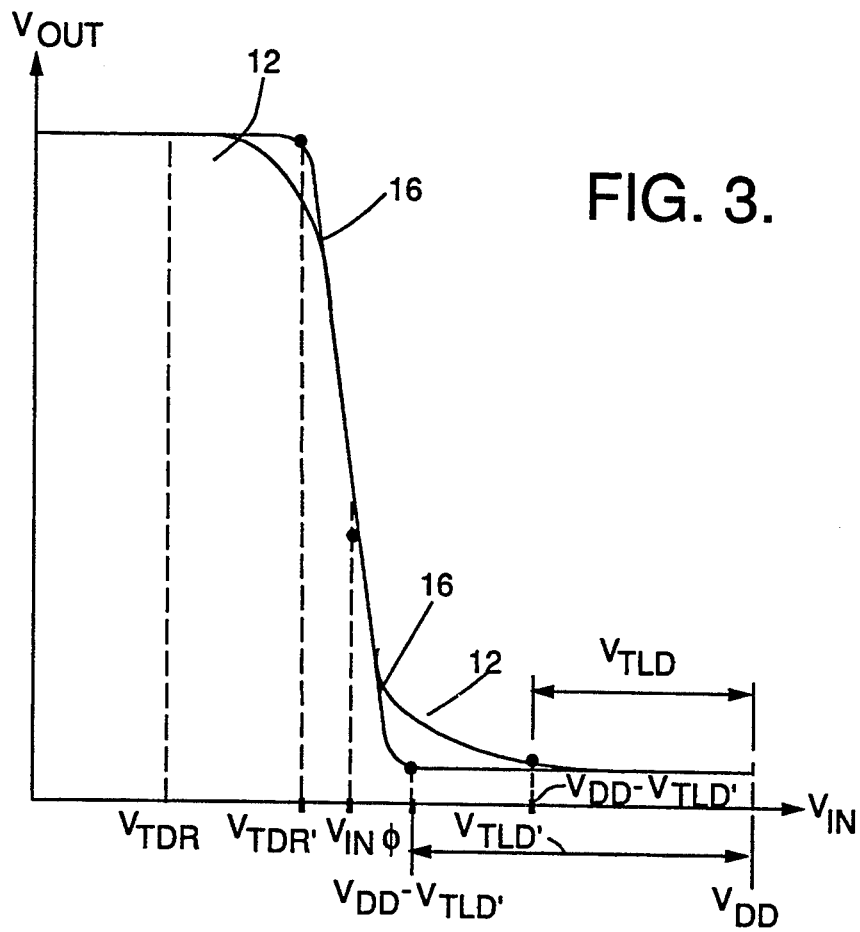
FIG. 3 is a graph illustrating how the voltage transfer function for the inverter of FIG. 1 is altered in accordance with the present invention.

FIG. 3 illustrates how the inverter circuit 10 can be modified or altered in accordance with the present invention to switch only below a maximum switching speed which is lower, preferably at least ten times lower, than the maximum switching speed of the unaltered circuit 10. A disguised microelectronic integrated digital logic circuit embodying the present invention which incorporates an unaltered inverter and an altered inverter is designed to normally operate at a predetermined operating switching (clock) speed which is higher than the maximum switching speed of the altered inverter, and lower than the maximum switching speed of the unaltered inverter. In addition, the maximum switching speed of the altered inverter is higher than a maximum test switching speed at which the circuit is capable of being tested using known low speed test procedures. The transfer curve 12 of the inverter circuit 10 in unaltered form is presented again in FIG. 3.

Further illustrated in FIG. 3 is a transfer curve 16 which is approximately centered on the switching voltage $V_{IN0}$, but has a much steeper shape. The curve 16 is produced by altering the values of $T_R$, $V_{TLD}$ and $V_{TDR}$ in accordance with equations (7) and (8) such that the rise time $T_R$ is much longer than for the curve 12. As a result, the curve 16 has altered values of the threshold voltages $V_{TDR}$ and $V_{TLD}$, designated as $V_{TDR'}$ and $V_{TLD'}$ respectively, which are shifted from the corresponding values for the curve 12 toward the switching voltage $V_{IN0}$. The altered threshold voltages for the curve 16 are approximately symmetrical about the switching voltage $V_{IN0}$ as with the curve 12.

As the voltage difference between the threshold points $V_{TDR'}$ and $V_{DD}-V_{TLD2'}$ of the curve 16 is much smaller than that between the threshold points $V_{TDR}$ and $V_{DD}-V_{TLD}$ for the curve 12, the altered inverter circuit will require substantially more time for the capacitance C to charge and discharge than with the unaltered inverter circuit, as expressed by equation (5). Thus, if an attempt is made to switch the altered inverter circuit at a speed which is higher than a value corresponding to the increased rise time, the capacitor C will not charge or discharge sufficiently for the output voltage $V_{OUT}$ transition through the switching voltage $V_{IN0}$, and the circuit will not switch. Instead, the inverter will remain in whichever state (logically high or low) it was in before the switching attempt was made.

Figure 4:
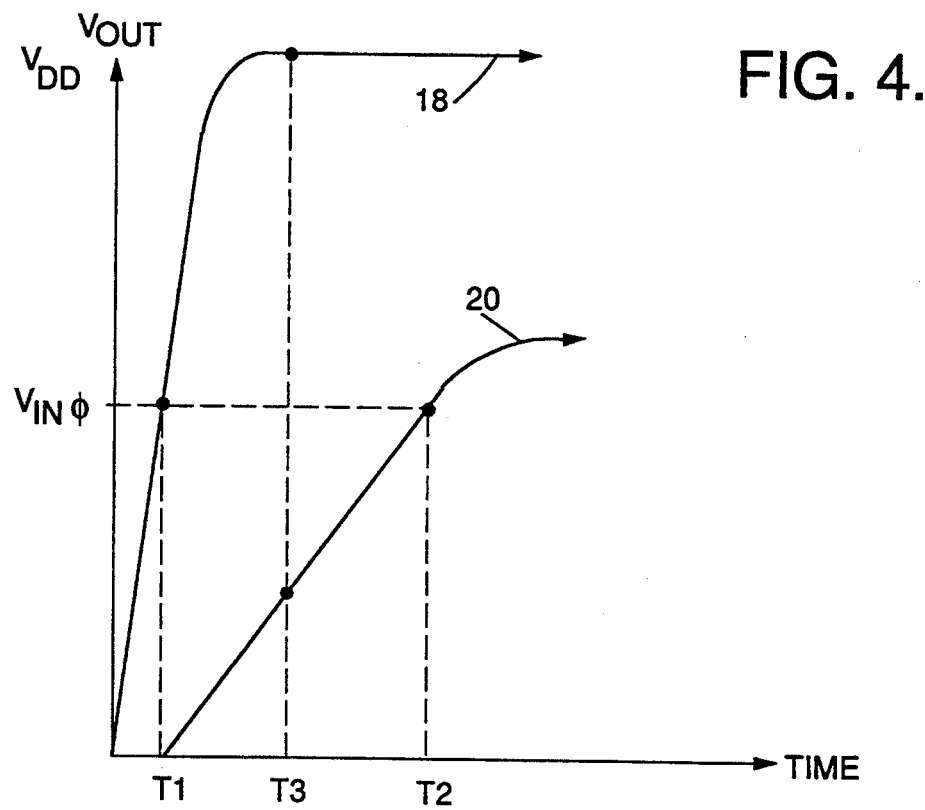
FIG. 4 is a graph illustrating the switching times for the unaltered and altered inverters.

The alteration is further illustrated in FIG. 4. The output voltage of the inverter circuit as a function of time is plotted for the unaltered circuit as a curve 18, and for the altered circuit as a curve 20. Assuming that the input voltage $V_{IN}$ is switched from $V_{DD}$ to zero, the output voltage $V_{OUT}$ for the unaltered circuit will reach the switching voltage $V_{IN0}$ in a time T1, whereas the output voltage $V_{OUT}$ for the altered circuit will require a substantially longer time T2 to reach the switching voltage $V_{IN0}$. Assuming a switching speed for normal operation having a corresponding time switching time T3 which is intermediate between T1 and T2, the unaltered circuit will switch whereas the altered circuit will not switch.

The threshold voltages $V_{TLD}$ and $V_{TDR}$ are preferably altered by implanting the channels of the FETs M2 and M1 respectively using an FIB, although the threshold voltages may be altered using other means within the scope of the invention. Where the inverter circuit 10 is fabricated on a silicon substrate, the threshold voltage $V_{TDR}$ of the driver FET M1 may be made more positive by implantation of an acceptor (p-type) ion species such as boron, whereas the threshold voltage $V_{TLD}$ may be made more negative by implantation of a donor (n-type) ion species such as arsenic. The fabrication of FETs with threshold voltages altered by ion implantation is well known in the art per se, such as described in a textbook entitled "ANALYSIS AND DESIGN OF DIGITAL INTEGRATED CIRCUITS" SECOND EDITION, by D. Hodges et al, McGraw Hill 1988, in section 2.3, pp. 29-35, entitled "THRESHOLD VOLTAGE OF THE MOS TRANSISTOR".

An example of how the present invention may be applied to dynamically disguise a microelectronic integrated digital NMOS logic circuit 22 is illustrated in FIG. 5. The output $V_{OUT1}$ of the inverter circuit 10 is applied as one input to a NAND gate 24 which includes a depletion mode active load FET M4 connected in series circuit with driver FETs M3 and M5. A first input voltage $V_{IN1}$ is applied to the gate of the FET M1, whereas the output $V_{OUT1}$ of the inverter circuit 10 is applied to the gate of the FET M3. A second input $V_{IN2}$ is applied to the gate of the FET M5.

If none of the FETs in the logic circuit 22 are altered, the circuit 22 will produce a logically low output $V_{OUT2}$ when $V_{IN1}$ is low and $V_{IN2}$ is high, and produce a logically high output for all other combinations of $V_{IN1}$ and $V_{IN2}$.

The circuit 22 can be disguised, for example, by altering the FETs M1 and M2 as described above such that they will switch only at low speed, and designing the overall circuit logic such that the input $V_{IN1}$ will be high when the drain supply $V_{DD}$ is initially applied to the circuit 22. Although the circuit 22 will function in the normal manner described above at low speed, the FETs M1 and M2 will not switch at high speed. Thus, the FET M1 will be always on, the output $V_{OUT1}$ will be always low, the FET M3 will be always off, and the circuit 22 will produce a logically high output $V_{OUT2}$ for all combinations of inputs $V_{IN1}$ and $V_{IN2}$.

The circuit 22 may also be altered to produce a logically high output for all combinations of inputs $V_{IN1}$ and $V_{IN2}$ by altering the FETs M4 and M5 such that they will not switch at high speed, and designing the overall circuit logic such that the input $V_{IN2}$ will be low when the drain supply is initially applied to the circuit 22. The FET M5 will remain always off if an attempt is made to switch the circuit 22 at high speed.

The altered and unaltered FETs are logically associated with each other in a predetermined manner within the overall logic of the microelectronic integrated digital logic circuit in which they are incorporated. The altered and unaltered FETs may be elements of the same gate, elements of different gates which are connected to each other to perform a composite logic function, or elements of unconnected gates (one or both of which may be dummy gates).

FIG. 6 illustrates an inverter circuit 26 implemented with CMOS FETs in a symmetrical configuration. An NMOS FET M6 is connected in series circuit with a p-channel enhancement mode (PMOS) FET M7 across the drain supply $V_{DD}$ and ground. An input $V_{IN}$ is applied to the gates of both FETs M6 and M7. The output $V_{OUT}$ is taken at the junction of the FETs M6 and M7.

The FET M6 has a threshold voltage $V_{TN}$ which is more positive than zero, whereas the FET M7 has a threshold voltage $V_{TP}$ which is more negative than zero. When $V_{IN}$ is logically high, the FET M6 is turned on and the FET M7 is turned off, producing a logically low output $V_{OUT}$. For a logically low input $V_{IN}$, the FET M7 is turned on and the FET M6 is turned off, producing a logically high output $V_{OUT}$. The voltage transfer curves for the inverter circuit 26 are similar to the curve 12 (unaltered circuit) illustrated in FIGS. 2 and 3, and the curve 16 (altered circuit) illustrated in FIG. 3 respectively. The threshold voltage $V_{TN}$ of the FET M6 of FIG. 6 corresponds to the threshold voltage $V_{TDR}$ of the driver FET M1 of FIG. 1, whereas the threshold voltage $V_{TP}$ of the FET M7 of FIG. 6 corresponds to the threshold voltage $V_{TLD}$ of the load FET M2 of FIG. 1.

The threshold voltages $V_{TN}$ and $V_{TP}$ of the FETs M6 and M7 of the CMOS inverter circuit 26 may be altered in a manner which is similar to that described above with reference to the NMOS inverter circuit 10 illustrated in FIG. 1 to make the maximum switching speed of the altered inverter circuit 26 much slower than that of the unaltered inverter circuit.

More specifically, the current $I_P$ through the PMOS FET M7 in the saturation region is given as $$I_P = \frac{W_P}{L} K_P (V_{IN} - V_{DD} - V_{TP})^2 (1 + \lambda_P (V_{DD} - V_{OUT})) \quad \text{equ. 9}$$

The current $I_N$ through the NMOS FET M6 in saturation is given as $$I_N = \frac{W_N}{L} K_N (V_{IN} - V_{TN})^2 (1 + \lambda_N (V_{OUT})) \quad \text{equ. 10}$$

Assuming for simplicity that the channel-length modulation $\lambda$ is the same for the FETs M6 and M7, equating the currents $I_N = I_P$ produces $$V_{IN} = \frac{V_{TN} + \sqrt{\beta_R} (V_{DD} + V_{TP})}{1 + \sqrt{\beta_R}}, \beta_r = \frac{W_P K_P}{W_N K_N} \quad \text{equ. 11}$$

Setting $V_{IN} = V_{DD}/2$ (where $V_{DD}/2$ is the switching voltage corresponds to the voltage $V_{IN0}$ in the NMOS case), gives $$V_{TN} + \sqrt{\beta_R} V_{TP} = \frac{V_{DD}}{2} (1 - \sqrt{\beta_R}) \quad \text{equ. 12}$$

The rise time $T_R$ is approximated as $$T_R \approx \frac{L C V_{DD}}{W_P K_P (V_{DD} + V_{TP})^2} \quad \text{equ. 13}$$

The threshold voltage $V_{TP}$ for the PMOS FET M7 which produces a selected rise time $T_R$ is $$V_{TP} \approx \sqrt{\frac{L C V_{DD}}{W_P K_P T_R}} - V_{DD} \quad \text{equ. 14}$$

whereas the corresponding threshold voltage $V_{TN}$ for the NMOS FET M6 is $$V_{TN} = \frac{V_{DD}}{2} (1 - \sqrt{\beta_R}) - \sqrt{\beta_R} V_{TP} \quad \text{equ. 15}$$

The switching speed can be slowed down by an even greater extent by operating the altered CMOS inverter circuit 26 in the subthreshold region. For example, where $\beta_R = 1$, equation (12) reduces to $V_{TN} = -V_{TP}$, and subthreshold operation requires that $V_{TN} + |V_{TP}| > V_{DD}$.

An example of how the present invention may be applied to dynamically disguise a microelectronic integrated digital CMOS logic circuit 28 is illustrated in FIG. 7. The output $V_{OUT1}$ of the inverter circuit 26 is applied as one input to a NOR gate 29 which includes PMOS FETs M9 and M11 connected in series circuit with an NMOS FET M8 between the drain supply $V_{DD}$ and ground. An NMOS FET M10 is connected in parallel circuit with the FET M8. A first input voltage $V_{IN1}$ is applied to the gates of both FETs M6 and M7, whereas the output $V_{OUT1}$ of the inverter circuit 26 is applied to the gates of both FETs M8 and M9. A second input $V_{IN2}$ is applied to the gates of both FETs M10 and M11.

If none of the FETs in the logic circuit 28 are altered, the circuit 28 will produce a logically high output $V_{OUT2}$ when $V_{IN1}$ is high and $V_{IN2}$ is low, and produce a logically low output for all other combinations of $V_{IN1}$ and $V_{IN2}$.

The circuit 28 can be disguised, for example, by altering the FETs M6 and M7 as described above such that they will switch only at low speed, and designing the overall circuit logic such that the input $V_{IN1}$ will be low when the drain supply $V_{DD}$ is initially applied to the circuit 28. Although the circuit 28 will function in the normal manner described above at low speed, the FETs M6 and M7 will not switch at high speed. Thus, the FET M6 will be always off, the FET M7 will be always on, the output $V_{OUT1}$ will be always high, the FET M8 will be always on, the FET M9 will be always off, and the circuit 28 will produce a logically low output $V_{OUT2}$ for all combinations of inputs $V_{IN1}$ and $V_{IN2}$.

The circuit 28 may also be altered to produce a logically low output for all combinations of inputs $V_{IN1}$ and $V_{IN2}$ by altering the FETs M10 and M11 such that they will not switch at high speed, and designing the overall circuit logic such that the input $V_{IN2}$ will be high when the drain supply is initially applied to the circuit 28. The FET M10 will remain always on and the FET M11 will remain always off if an attempt is made to switch the circuit 28 at high speed.

Figure 8A:
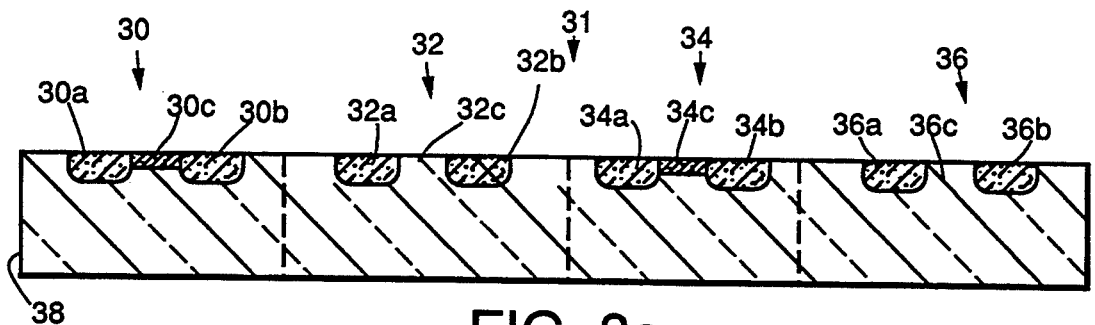
FIGS. 8a to 8d are simplified diagrams illustrating a method of fabricating an NMOS microelectronic integrated digital logic circuit embodying the present invention.

FIGS. 8a to 8d are simplified diagrams illustrating a method of fabricating an NMOS microelectronic integrated digital logic circuit 31 embodying the present invention. In FIG. 8a, NMOS FETs 30, 32, 34 and 36 are partially formed in the surface of a p-type silicon substrate 38, including sources 30a, 32a, 34a and 36a and drains 30b, 32b, 34b and 36b which are formed by implantation of n-type ions in a conventional manner.

The FETs 32 and 36 are driver FETs, whereas the FETs 30 and 34 are depletion mode active load FETs which are logically associated with the FETs 32 and 34 respectively. For example, the FETs (30,32) and the FETs (34,36) may be interconnected to constitute an inverter circuits such as described with reference to FIG. 1. The FETs 30 and 34 further include channels 30c and 34c respectively which are conventionally doped with an n-type impurity to produce depletion mode operation. The FETs 32 and 36 have channels 32c and 36c which are not implanted to produce enhancement mode operation. The FETs 30, 32, 34 and 36 in the partially fabricated NMOS microelectronic integrated digital logic circuit of FIG. 8a would operate normally as illustrated in FIG. 2 if the fabrication were completed in the conventional manner.

Figure 8B:
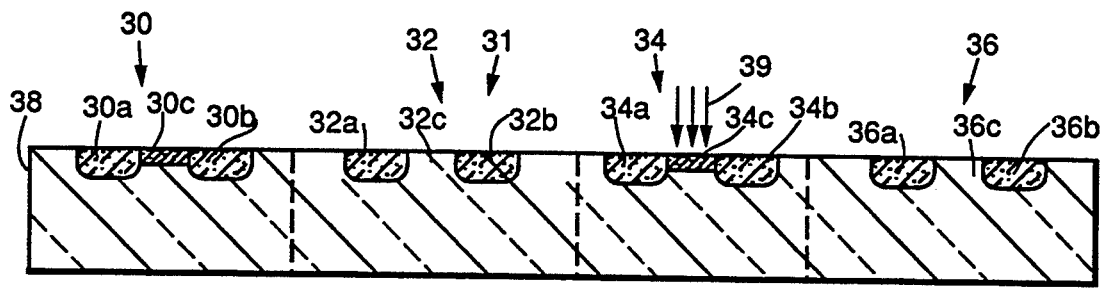
Figure 8C:
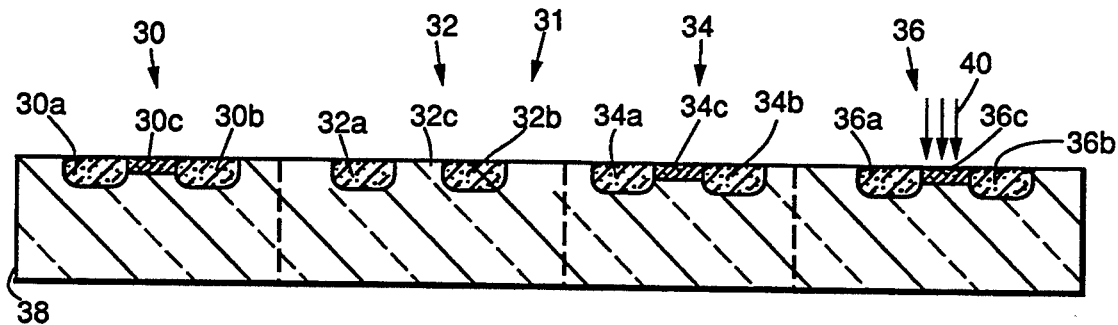

In the next step as illustrated in FIG. 8b, the channel 34c of the depletion load FET 34 is implanted using an FIB as indicated by arrows 39 with n-type ions to alter the doping of the channel 34c and thereby change the threshold voltage of the FET 34 from $V_{TLD}$ to $V_{TLD}'$ as illustrated in FIG. 3. Then, as illustrated in FIG. 8c, the channel 36c of the driver FET 36 is implanted using an FIB as indicated by arrows 40 with p-type ions to alter the doping of the channel 36c and thereby change the threshold voltage of the FET 36 from $V_{TDR}$ to $V_{TDR'}$ as illustrated in FIG. 3.

Figure 8D:
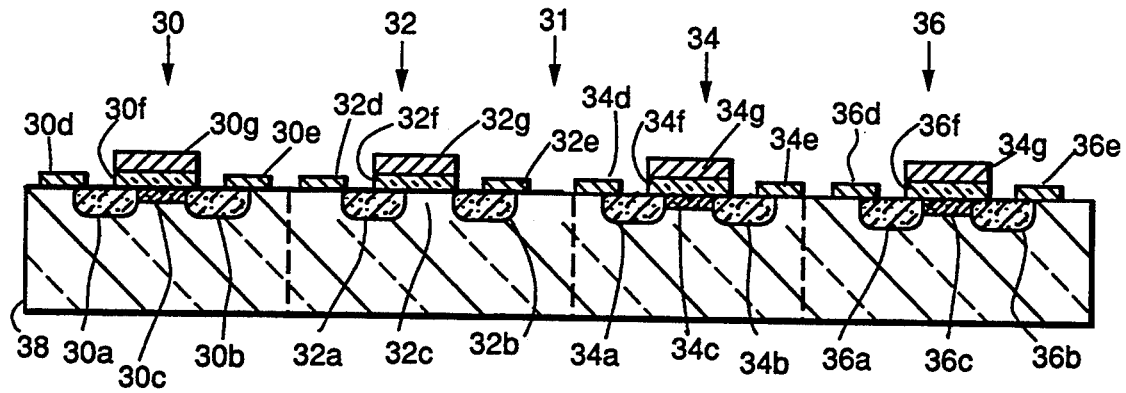

FIG. 8d illustrates how the NMOS microelectronic integrated digital logic circuit is further processed using conventional steps to form source metal contacts 30d, 32d, 34d and 36d, drain metal contacts 30e, 32e, 34e and 36e, gate oxide layers 30f, 32f, 34f and 36f, and gate metal contacts 30g, 32g, 34g and 36g on the substrate 38. In the finished circuit, the inverter circuit including the FETs 30 and 32 will operate in the normal manner, whereas the inverter circuit including the FETs 34 and 36 will only switch at low speed in the manner described above.

Figure 9:
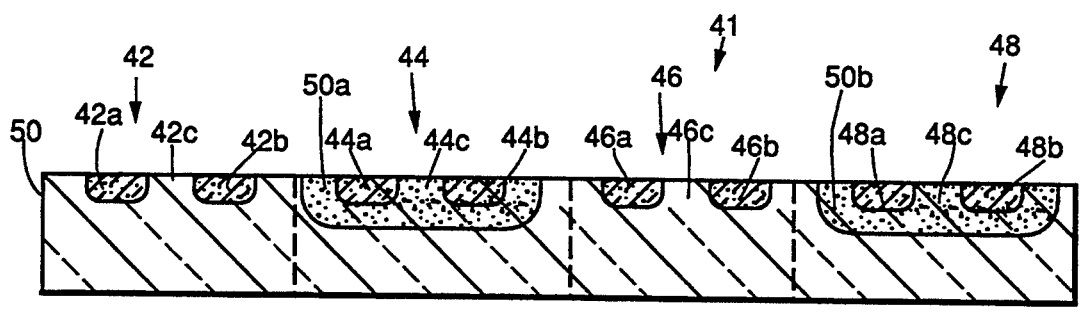
FIGS. 9a to 9d are simplified diagrams illustrating a method of fabricating a CMOS microelectronic integrated digital logic circuit embodying the present invention.
Figure 9:
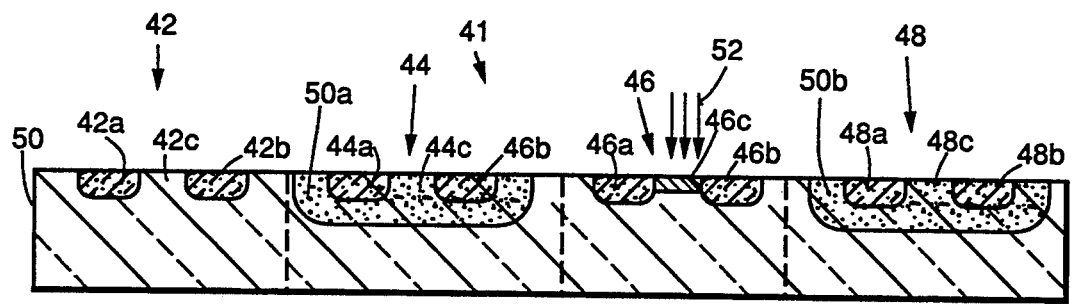
Figure 9:
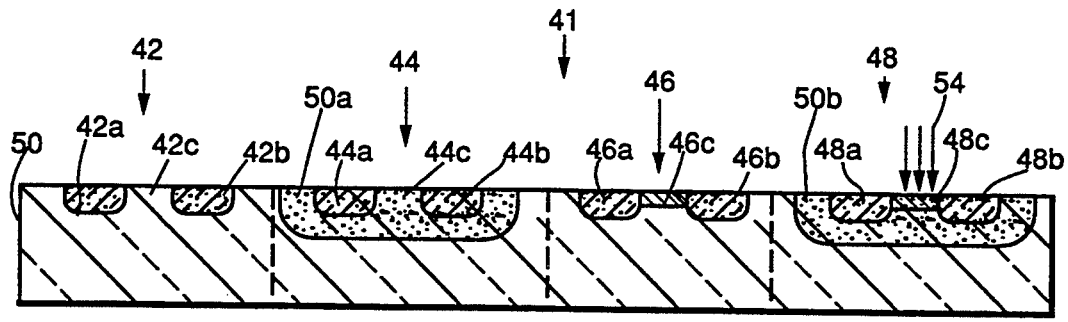

FIGS. 9a to 9d are simplified diagrams illustrating a method of fabricating a CMOS microelectronic integrated digital logic circuit 41 embodying the present invention. In FIG. 9a, NMOS FETs 42, 44, 46 and 48 are partially formed in the surface of an n-type silicon substrate 50. The FETs 42 and 44 are PMOS FETs, and include sources 40a, and 44a, and drains 40b and 44b respectively which are formed by implantation of p-type ions in a conventional manner.

The FETs 44 and 48 are NMOS FETs, and are formed in p-type wells 50a and 50b respectively which are implanted in the surface of the substrate 50. The FETs 44 and 48 include n-type implanted sources 44a and 48a, and drains 44b and 48b respectively. Channels 42c, 44c, 46c and 48c are defined between the sources and drains of the respective FETs.

The FETs (42,44) and the FETs (46,48) may be interconnected to constitute inverter circuits such as described with reference to FIG. 6. The FETs 42, 44, 46 and 48 in the partially fabricated CMOS microelectronic integrated digital logic circuit of FIG. 8a would operate normally if the fabrication were completed in the conventional manner.

In the next step as illustrated in FIG. 9b, the channel 46c of the PMOS FET 46 is implanted using an FIB as indicated by arrows 52 with n-type ions to alter the doping of the channel 46c and thereby make the threshold voltage of the FET 46 more negative. Then, as illustrated in FIG. 9c, the channel 48c of the NMOS FET 48 is implanted using an FIB as indicated by arrows 54 with p-type ions to alter the doping of the channel 48c and thereby make the threshold voltage of the FET 48 more positive.

Figure 9D:
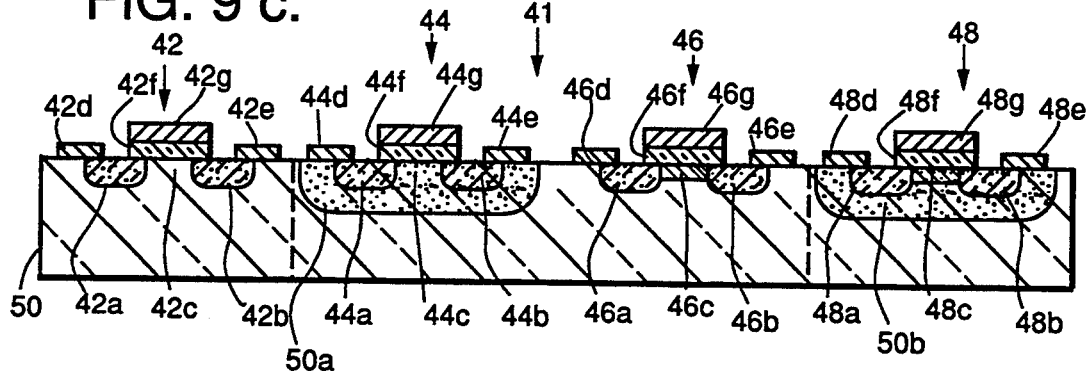

FIG. 9d illustrates how the CMOS microelectronic integrated digital logic circuit is further processed using conventional steps to form source metal contacts 42d, 44d, 46d and 48d, drain metal contacts 42e, 44e, 46e and 48e, gate oxide layers 42f, 44f, 46f and 48f, and gate metal contacts 42g, 44g, 46g and 48g on the substrate 50. In the finished circuit, the inverter circuit including the FETs 42 and 44 will operate in the normal manner, whereas the inverter circuit including the FETs 46 and 48 will only switch at low speed in the manner described above.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. A method of fabricating a microelectronic integrated digital logic circuit designed to operate at an operating switching speed so that the circuit is resistant to reverse engineering testing performed at a test switching speed that is slower than said operating switching speed, comprising the steps of:
   (a) forming a first microelectronic digital switching element on a substrate, the first switching element including a first field-effect transistor (FET) having a first channel with a first doping concentration which produces a corresponding first threshold voltage for said first switching element, and a corresponding first switching speed capability for said first switching element which is higher than said operating switching speed; and
   (b) forming a second microelectronic digital switching element which is connected in a logic circuit with the first switching element on the substrate, the second switching element including a second FET having a second channel with a second doping concentration which produces a corresponding second threshold voltage for said second switching element, and a corresponding second switching speed capability for said second switching element which is slower than said operating switching speed, slower than the first switching element's switching speed capability, but faster than said test switching speed;
the first and second switching element both being capable of switching at said test switching speed, but only the first switching element being capable of switching at the operating switching speed, such that the circuit operates differently at the test switching speed than at the operating switching speed.

2. A method as in claim 1, in which:
   steps (a) and (b) in combination comprise the substeps of:
   (c) partially forming the first and second FETs simultaneously and integrally such that the respective first and second channels both have the first doping concentration; and
   (d) increasing the doping concentration of the second channel to said second doping concentration.

3. A method as in claim 2, in which step (d) comprises implanting ions into the second channel.

4. A method as in claim 1, further comprising the step of:
   (c) further forming the second switching element as including a third FET which is connected in circuit with the second FET to constitute an active load, the third FET having a third channel with a third doping concentration which produces a corresponding third threshold voltage such that the second and third threshold voltages are different from the second switching voltage by opposite and approximately equal voltages respectively.

5. A method as in claim 4, in which step (c) comprises forming the third FET such that the active load is a depletion mode load.

6. A method as in claim 5, in which steps (b) and (c) comprise forming the second and third FETs as n-channel metal-oxide-semiconductor (NMOS) FETs.

7. A method as in claim 1, in which:
   step (b) comprises forming the second FET as a complementary metal-oxide-semiconductor (CMOS) FET of a first conductivity type; and
   the method further comprises the step of:

(c) forming the second switching element as further including a third FET which is a CMOS FET of a second conductivity type which is opposite to the first conductivity type, the third FET being connected in circuit with the second FET such that the second switching element is a CMOS element, the third FET having a third channel with a third doping concentration which produces a corresponding third threshold voltage such that the second and third threshold voltages are different from the second switching voltage by opposite and approximately equal voltages respectively.

8. A method as in claim 1, in which:

step (b) comprises forming the second FET as a complementary metal-oxide-semiconductor (CMOS) FET of a first conductivity type; and the method further comprises the step of:

(c) forming the second switching element as further including a third FET which is a CMOS FET of a second conductivity type which is opposite to the first conductivity type, the third FET being connected in circuit with the second FET such that the second switching element is a CMOS element, the third FET having a third channel with a third doping concentration which produces a corresponding third threshold voltage, the second and third threshold voltages being selected to cause subthreshold operation of the second and third FETs.

9. A method of fabricating a microelectronic integrated digital logic circuit designed to operate at an operating switching speed so that the circuit is resistant to reverse engineering testing performed at a test switching speed that is slower than said operating switching speed, comprising the steps of:

(a) forming first and second microelectronic digital switching elements on a substrate, said first and second switching elements including respective first and second field-effect transistors (FETs) having respective first and second channels with equal doping concentrations which produce equal threshold voltages and equal switching speed capabilities for said first and second switching elements, said switching speed capabilities being higher than said operating switching speed; and (b) thereafter altering the doping concentration of said second FET so that its switching speed capability is reduced to a speed slower than said operating switching speed but faster than said test switching speed;

the first switching element and the altered second switching element both being capable of switching at said test switching speed, but only the first switching element being capable of switching at the operating switching speed, such that the circuit operates differently at the test switching speed than at the operating switching speed.

10. A method as in claim 9, further comprising the step of:

(c) further forming the second switching element as including a third FET which is connected in circuit with the second FET to constitute an active load, the third FET having a third channel with a third doping concentration which produces a corresponding third threshold voltage such that the second and third threshold voltages are different from the second switching voltage by opposite and approximately equal voltages respectively.

11. A method as in claim 10, in which step (c) comprises forming the third FET such that the active load is a depletion mode load.

12. A method as in claim 11, in which steps (b) and (c) comprise forming the second and third FETs as n-channel metal-oxide-semiconductor (NMOS) FETs.

13. A method as in claim 9, in which:

step (b) comprises forming the second FET as a complementary metal-oxide-semiconductor (CMOS) FET of a first conductivity type; and the method further comprises the step of:

(c) forming the second switching element as further including a third FET which is a CMOS FET of a second conductivity type which is opposite to the first conductivity type, the third FET being connected in circuit with the second FET such that the second switching element is a CMOS element, the third FET having a third channel with a third doping concentration which produces a corresponding third threshold voltage such that the second and third threshold voltages are different from the second switching voltage by opposite and approximately equal voltages respectively.

14. A method as in claim 9, in which:

step (b) comprises forming the second FET as a complementary metal-oxide-semiconductor (CMOS) FET of a first conductivity type; and the method further comprises the step of:

(c) forming the second switching element as further including a third FET which is a CMOS FET of a second conductivity type which is opposite to the first conductivity type, the third FET being connected in circuit with the second FET such that the second switching element is a CMOS element, the third FET having a third channel with a third doping concentration which produces a corresponding third threshold voltage, the second and third threshold voltages being selected to cause subthreshold operation of the second and third FETs.

* * * * *